United States Patent
Sago et al.

(10) Patent No.: US 7,323,081 B2
(45) Date of Patent: Jan. 29, 2008

(54) HIGH-FREQUENCY PLASMA PROCESSING APPARATUS

(75) Inventors: Yasumi Sago, Tokyo (JP); Masayoshi Ikeda, Tokyo (JP); Nobuaki Tsuchiya, Tokyo (JP); Hisaaki Sato, Tokyo (JP)

(73) Assignee: Canon Anelva Corporation, Tokyo (JP)

( * ) Notice: Subject to any disclaimer, the term of this patent is extended or adjusted under 35 U.S.C. 154(b) by 174 days.

(21) Appl. No.: 10/341,353

(22) Filed: Jan. 14, 2003

(65) Prior Publication Data

US 2004/0134616 A1 Jul. 15, 2004

(51) Int. Cl.
*H01L 21/306* (2006.01)

(52) U.S. Cl. .............................. 156/345.47; 118/723 E (58) Field of Classification Search ............ 118/723 E; 315/111.21; 156/345.43, 345.44, 345.45, 156/345.46, 345.47
See application file for complete search history.

(56) References Cited

U.S. PATENT DOCUMENTS

| | | | |
|---|---|---|---|
| 4,579,618 A | | 4/1986 | Celestino et al. |
| 5,210,466 A | * | 5/1993 | Collins et al. .......... 315/111.21 |
| 5,223,457 A | | 6/1993 | Mintz et al. |
| 5,272,417 A | * | 12/1993 | Ohmi ..................... 315/111.21 |
| 5,605,576 A | * | 2/1997 | Sasaki et al. ............ 118/723 E |
| 5,707,486 A | * | 1/1998 | Collins ................... 156/345.38 |
| 6,199,505 B1 | * | 3/2001 | Sato et al. ............... 118/723 E |
| 6,270,618 B1 | * | 8/2001 | Nakano et al. ........ 156/345.44 |

FOREIGN PATENT DOCUMENTS

| | | |
|---|---|---|
| JP | 63-50025 | 3/1988 |
| JP | 03-283300 | 12/1991 |
| JP | 04-078133 | 3/1992 |
| JP | 06-243994 | 9/1994 |
| JP | 07-147200 | 6/1995 |
| JP | 11-185998 | 7/1999 |
| JP | 11297496 A * | 10/1999 |
| JP | 2000-286198 | 10/2000 |

OTHER PUBLICATIONS

Les Besser et al.; "Practical RF Circuit Design for Modern Wireless Systems"; pp. 42-43; vol. 1, Artech House Inc., 2003.

* cited by examiner

*Primary Examiner*—Parviz Hassanzadeh
*Assistant Examiner*—Michelle Crowell
(74) *Attorney, Agent, or Firm*—Hogan & Hartson LLP (57) ABSTRACT

This application discloses a High-Frequency plasma processing apparatus comprising a process chamber in which a substrate to be processed is placed, a process-gas introduction line for introducing a process gas into the process chamber, a first HF electrode provided in the process chamber, a first HF power source for applying voltage to the first HF electrode, thereby generating plasma of the process gas. The apparatus further comprises a second HF electrode facing the first HF electrode in the process chamber, interposing discharge space, and a series resonator connecting the second electrode and the ground. The frequency of the first HF power source is not lower than 30 MHz. The series resonator is resonant as the distributed constant circuit at the frequency of the first HF power source.

11 Claims, 5 Drawing Sheets

Fig. 5

HIGH-FREQUENCY PLASMA PROCESSING APPARATUS

BACKGROUND OF THE INVENTION

1. Field of the Invention

This invention relates to a High-Frequency (HF) plasma processing apparatus, which processes a substrate, utilizing plasma generated by HF wave energy.

2. Description of the Related Art

Various surface processes onto substrates are required in manufacturing such electronic devices as LSIs (Large-Scale Integrated Circuits) and LCDs (Liquid Crystal Displays). Apparatuses utilizing plasma generated by an HF discharge are used for such the processes. This kind of apparatuses is hereinafter called "HF plasma processing apparatuses". Though "HF" usually means frequencies ranging from 3 MHz to 30 MHz, "HF" in this specification broadly means frequencies higher than MF (Medium-Frequency, 300 kHz to 3000 kHz), including VHF (Very-High-Frequency, 30 MHz to 300 MHz) and UHF (Ultra-High-Frequency, 300 MHz to 3000 MHz).

In an HF plasma processing apparatus, a substrate to be processed is held on a substrate holder in a process chamber. An HF discharge is ignited at the space facing the substrate, thereby processing the substrate. In etching the substrate, for example, plasma is generated introducing a fluorohydrocarbon gas into the process chamber. Utilizing reactions with radicals or activated species of fluorocarbon or fluorine, the surface of the substrate is etched. In depositing a film by HF sputtering, plasma is generated by a HF discharge, thereby sputtering a target. There has been well known the chemical vapor deposition (CVD) utilizing a gas-phase reaction in plasma generated by an HF discharge as well.

The described HF plasma processing apparatuses have ever employed frequencies ranging from 3 MHz to 30 MHz, such as 13.56 MHz allocated for industrial use. For enhancing process quality and process speed, however, higher frequencies have the advantage that plasma generation efficiency is improved. Because the probability of electrons to collide with neutral gas molecules is increased, higher frequencies can make the ionization efficiency higher, thus enhancing the plasma-generation efficiency. Enhancement of the plasma-generation efficiency means capability of reducing impurity inclusion by carrying out processes under lowered pressures, or capability of increasing process speed enabled by carrying out processes utilizing higher-density plasmas.

Form the research by the inventor, however, a higher frequency such as 60 MHz might bring the problem that efficiency of power supply to a process gas tends to decrease, resulting in that the power efficiency of a whole apparatus, i.e. process efficiency per input power, is not increased so much.

SUMMARY OF THE INVENTION

The invention of this application is to solve the above described subjects, and has the advantage of improving the power efficiency in utilizing a higher frequency such as in the VHF band. Concretely, the invention presents an HF plasma processing apparatus comprising a process chamber in which a substrate to be processed is placed, a process-gas introduction line for introducing a process gas into the process chamber, a first HF electrode provided in the process chamber, a first HF power source for applying voltage to the first HF electrode, thereby generating plasma of the process gas. The apparatus further comprises a second HF electrode facing the first HF electrode in the process chamber, interposing discharge space, and a series resonator connecting the second HF electrode and the ground via a variable reactance element. The frequency of the first HF power source is not lower than 30 MHz. The series resonator is resonant as the distributed constant circuit at the frequency of the first HF power source.

DETAILED DESCRIPTION OF THE PREFERRED EMBODIMENTS

Figure 1:
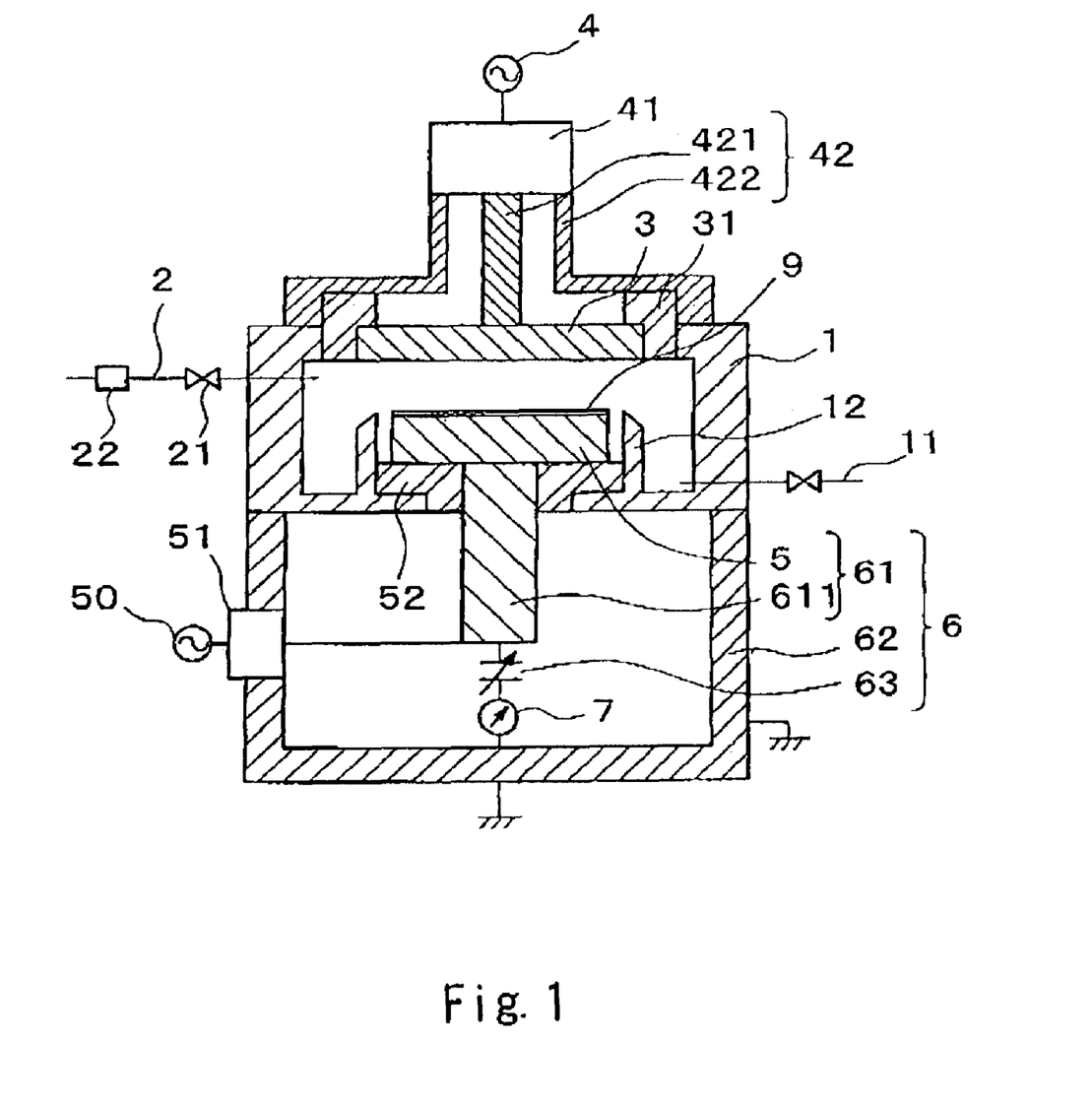
FIG. 1 is a schematic front cross-sectional view of the HF plasma processing apparatus as the first embodiment of the invention.

The preferred embodiments of this invention will be described as follows. FIG. 1 is a schematic front cross-sectional view of the HF plasma processing apparatus as the first embodiment of the invention. The apparatus shown in FIG. 1 comprises a process chamber 1 having a pumping line 11, a process-gas introduction line 2 for introducing a process gas into the process chamber 1, a plasma generation means for generating plasma in the process chamber 1 by igniting an HF discharge with the process gas, and a substrate holder 5 for holding the substrate 9 at a required position in the process chamber 1. The plasma generation means comprises a first HF electrode 3 provided in the process chamber 1, and a first HF power source 4 to apply HF voltage to the first HF electrode 3 for generating the plasma. The first HF power source 4 is connected with the first HF electrode 3 via a matching circuit 41.

The process chamber 1 is the air-tight vacuum chamber, with which a load-lock chamber (not shown) is connected interposing a gate-valve (not shown). The pumping line 11 is capable of pumping the process chamber 1 down at a required vacuum pressure by a vacuum pump such as turbo-molecular pump or diffusion pump. The apparatus shown in FIG. 1 is the one for carrying out an etching process. The process-gas introduction line 2 introduces the process gas having an etching function such as fluoride gas. The process-gas introduction line 2 comprises a valve 21 and a gas-flow controller 22, through which the process gas is introduced.

The first HF electrode 3 is circular-board-shaped, facing the substrate holder 5. The first HF electrode 3 is fitted air-tightly with the upper wall, interposing the insulator 31. A coaxial tube 42 is employed as the transmission line from the matching circuit 41 to the first HF electrode 3. The coaxial tube is composed essentially of an inner conductor 421 and an outer conductor 422. The outer conductor 422 is cylindrical and coaxial to the inner conductor 421. The coaxial tube 42 is coaxial to the first HF electrode 3.

The substrate holder 5 is the one for holding the substrate 9 on the top surface. The substrate 9 is held at the position in coaxial to the first HF electrode 3. The substrate 9 is thin and circular-board-shaped. The substrate holder 5 is also cylindrical. The substrate holder 5 in this embodiment is commonly used as a second HF electrode, which forms a discharge space together with the first HF electrode 3. The substrate holder 5 is insulated from the process chamber 1 by an insulator 52.

The substrate holder 5 chucks the substrate 9 by electro-static force. Not clearly shown in FIG. 1, the upper portion of the substrate holder 5 is made of dielectric, in which an electrode (not shown) is buried. A chucking power source (not shown) is provided to apply DC voltage to the electrode. When the DC voltage is applied, static electricity is induced on the top surface of the substrate holder 5, thereby chucking the substrate 9.

The apparatus of this embodiment employs a means for controlling ion-bombardment energy onto the substrate 9. Concretely, a second HF power source 50 that controls the ion-bombardment energy onto the substrate 9 is connected with the substrate holder 5 via a matching circuit 51. The HF voltage that the second HF power source 50 applies is to make ions incident on the substrate 9 with higher bombardment energy during the process. When the HF voltage is applied to the substrate 9, a time-averaged electric field is applied between the plasma and the substrate 9. This field is DC (Direct Current) and has gradient from the plasma toward the substrate 9. Ions in the plasma are accelerated to bombard the substrate 9. The energy of the bombarding ions enhances the etching rate and promotes the anisotropy of the etching, i.e. progress of the etching to the direction perpendicular to the substrate 9.

A shield 12 is provided, surrounding the substrate holder 5. The shield 12 is cylindrical and coaxial to the substrate 9 as well as the substrate holder 5. The shield 12 is to reduce the leakage of the HF power to the space below the substrate holder 5.

One point greatly characterizing this embodiment is that the power efficiency does not decrease nevertheless the frequency of the first HF power source 4 is not lower than 30 MHz. This point will be described in detail as follows. First of all, the frequency of the first HF power source 4 is, for example, 60 MHz in the VHF band. Such the first HF power source 4 is available from Denki Kogyo Co., Ltd. in Japan. As the first HF power source 4, the separate-excitation type that amplifies the output of a quartz crystal oscillator is preferable, and the transistor type is preferable because of large output.

Second, the apparatus comprises a coaxial resonator 6 composed essentially of an inner conductor 61 and an outer conductor 62 surrounding the inner conductor 61, which resonates in series at the frequency of the first HF power source 4. Concretely, the inner conductor 61 is composed essentially of the substrate holder 5, a support 611 and other componencts. The outer electrode 62 is cylindrical or hexagonal-tube-shaped, being coaxial to the inner conductor 61. The outer conductor 62 is fitted with the bottom of the process chamber 1. As shown in FIG. 1, the coaxial resonator 6 connects the substrate holder 5 and the ground via a variable capacitor 63. The variable capacitor 63 is provided at the lower part of the support 611. The variable capacitor 63 is controlled so that the resonance condition on the coaxial resonator 6 can be satisfied.

Figure 2:
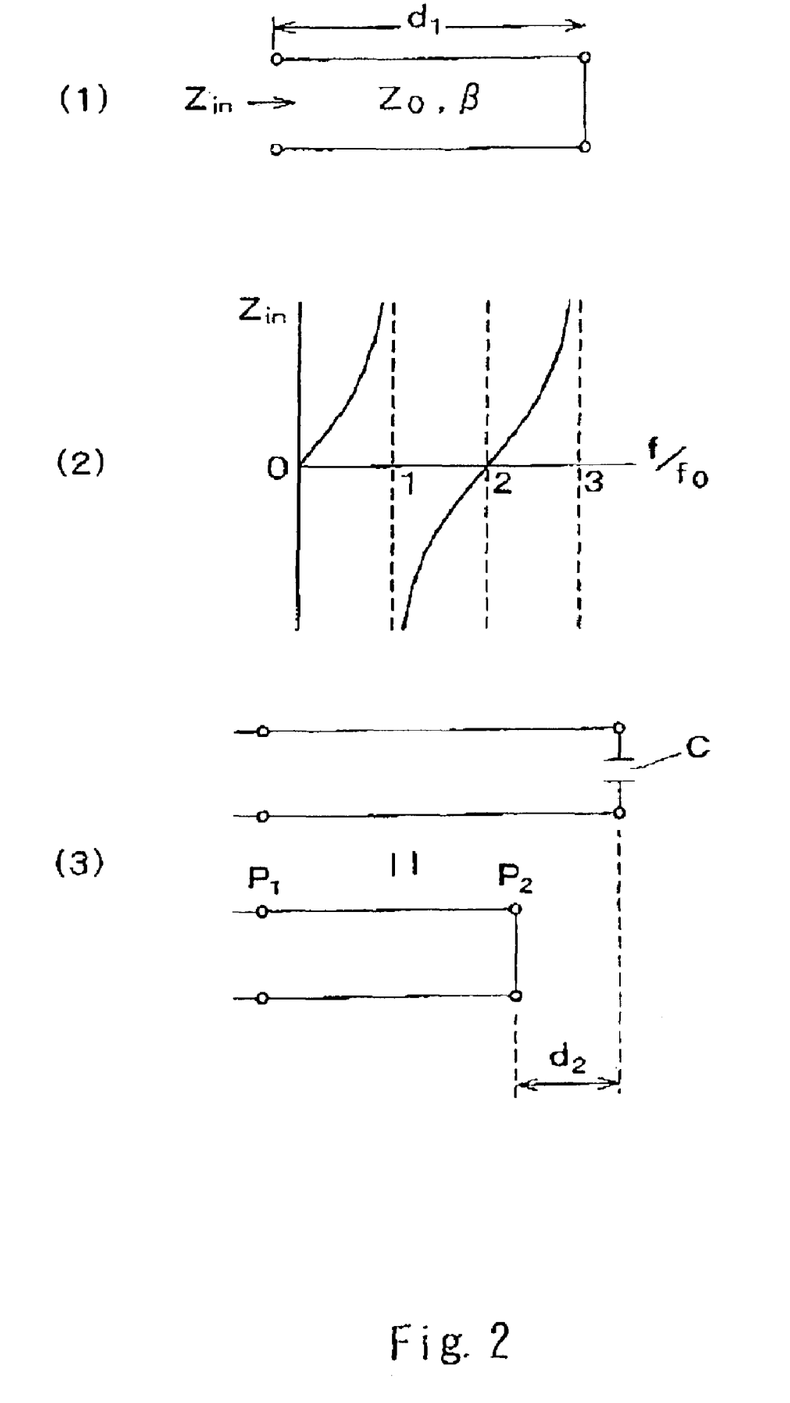
FIG. 2 explains the resonance condition on the coaxial resonator 6 shown in FIG. 1

The resonance condition on the coaxial resonator 6 shown in FIG. 1 will be described as follows, referring to FIG. 2. FIG. 2 explains the resonance condition on the coaxial resonator 6 shown in FIG. 1. Relationship of wavelength against circuit length such as on the circuit in this embodiment is necessarily dealt as a distributed constant circuit. Accordingly, the circuit in the apparatus of this embodiment is hereinafter described as the distributed constant circuit. In addition, in such limited space as in the apparatus, an HF circuit may be regarded lossless. The following description is on the premise that the circuit is lossless.

FIG. 2(1) shows a short-receiving-end type HF circuit. The coaxial resonator 6 comprising the variable capacitor 63 can be dealt as a phase-leading HF circuit having a short terminal. In FIG. 2(1); where characteristic impedance of the circuit is $Z_0$, phase constant is $\beta$, and distance from the sending end to the receiving end is $d_1$; the impedance z at the sending end toward the receiving end is expressed as $$Z = jZ_0 \tan(\beta d_1)$$

As known, depending on the length of $d_1$, Z alters to be 0 (i.e. series resonance), capacitive reactance, ∞ (i.e. parallel resonance) and inductive reactance.

Here, compared to a short-terminal circuit, phase of an HF wave advances on a circuit having a capacitor at the terminal. Therefore, as shown in FIG. 2(3), the circuit having a capacitor at the terminal corresponds to the circuit made short at the point $P_2$, of which length from the sending end is equal to the length gained by subtracting the distance $d_2$ from the distance $d_1$. Therefore, the impedance Z at the sending end $P_1$ toward the terminal is $$\begin{aligned} Z &= jZ_0\tan\{\beta(d_1 - d_2)\} \\ &= jZ_0\tan\{(2\pi/\lambda)(d_1 - d_2)\} \\ &= jZ_0\tan\{(2\pi d_1/\lambda) - \theta\} \end{aligned} \quad (1)$$

where $\theta = 2\pi d_2/\lambda$.

Figure 3:
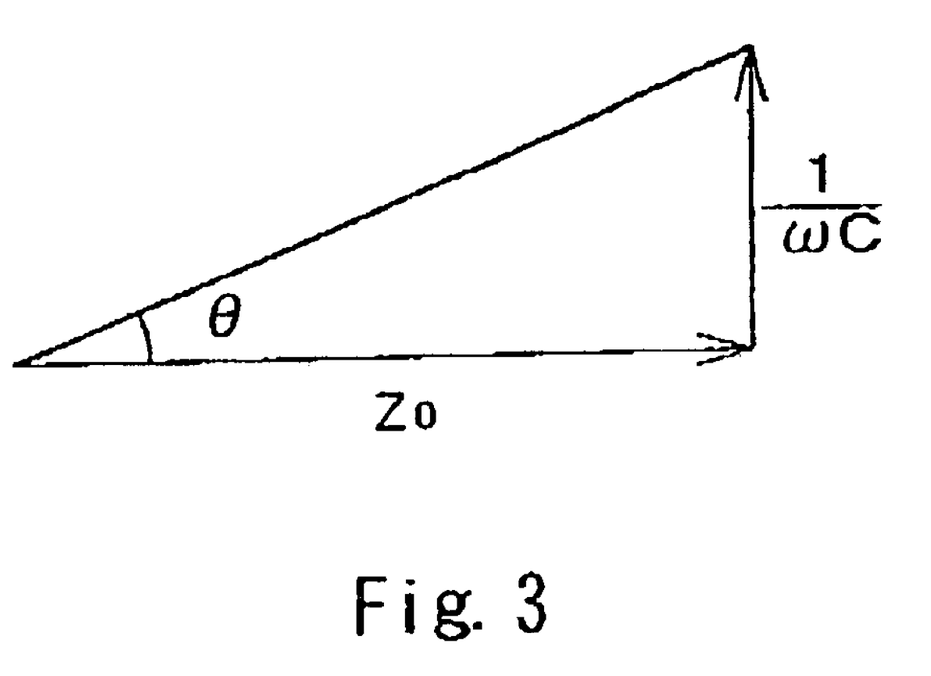
FIG. 3 explains the phase angle $\theta$ in the formula (1).

FIG. 3 explains the phase angle $\theta$ in formula (1). Because $\theta$ is the phase delay by the load capacitance against the characteristic impedance $Z_0$, where C is the load capacitance, $\theta$ is expressed as $$\theta = \tan^{-1}(1/Z_0 \omega C) \quad (2)$$

as understood from FIG. 3.

Now, as described, the coaxial resonator 6 shown in FIG. 1 corresponds to the circuit with a capacitor at the terminal. Therefore, revising the formula (1) and the formula (2) where $C_F$ is capacitance of the variable capacitor 63 shown in FIG. 1, the input impedance $Z_{in}$ of the coaxial resonator 6 and the phase angle $\theta$ are expressed as $$Z_{in} = jZ_0 \tan\{(2\pi x/\lambda) - \theta\} \quad (3)$$

$$\theta = \tan^{-1}(1/Z_0 \omega C_F) \quad (4)$$

In the formula(3), x is the length $d_1$ in the coaxial resonator 6. i.e. the length from the sending end to the terminal, which is hereinafter called "circuit length".

Assuming the frequency $f_0$ that satisfies $x = \lambda_0/4$, it is possible to revise $(2\pi/\lambda)x$ as $(2\pi/\lambda)x$ $= (2\pi/\lambda)(\lambda_0/4)$ $= (\pi/2)(\lambda_0/\lambda)$ $= (\pi/2)(f/f_0)$ $= (\pi/2)F \quad (5)$ Therefore, substituting the formula(5) into the formula(3), the input impedance $Z_{in}$, is $$Z_{in} = jZ_0 \tan\{(\pi/2)F - \theta\} \quad (6)$$
$$= jZ_0 \tan\{(\pi/2)(F - F_c)\}$$

where $F=f/f_0$, $F_c=\theta/(\pi/2)$.

Figure 4:
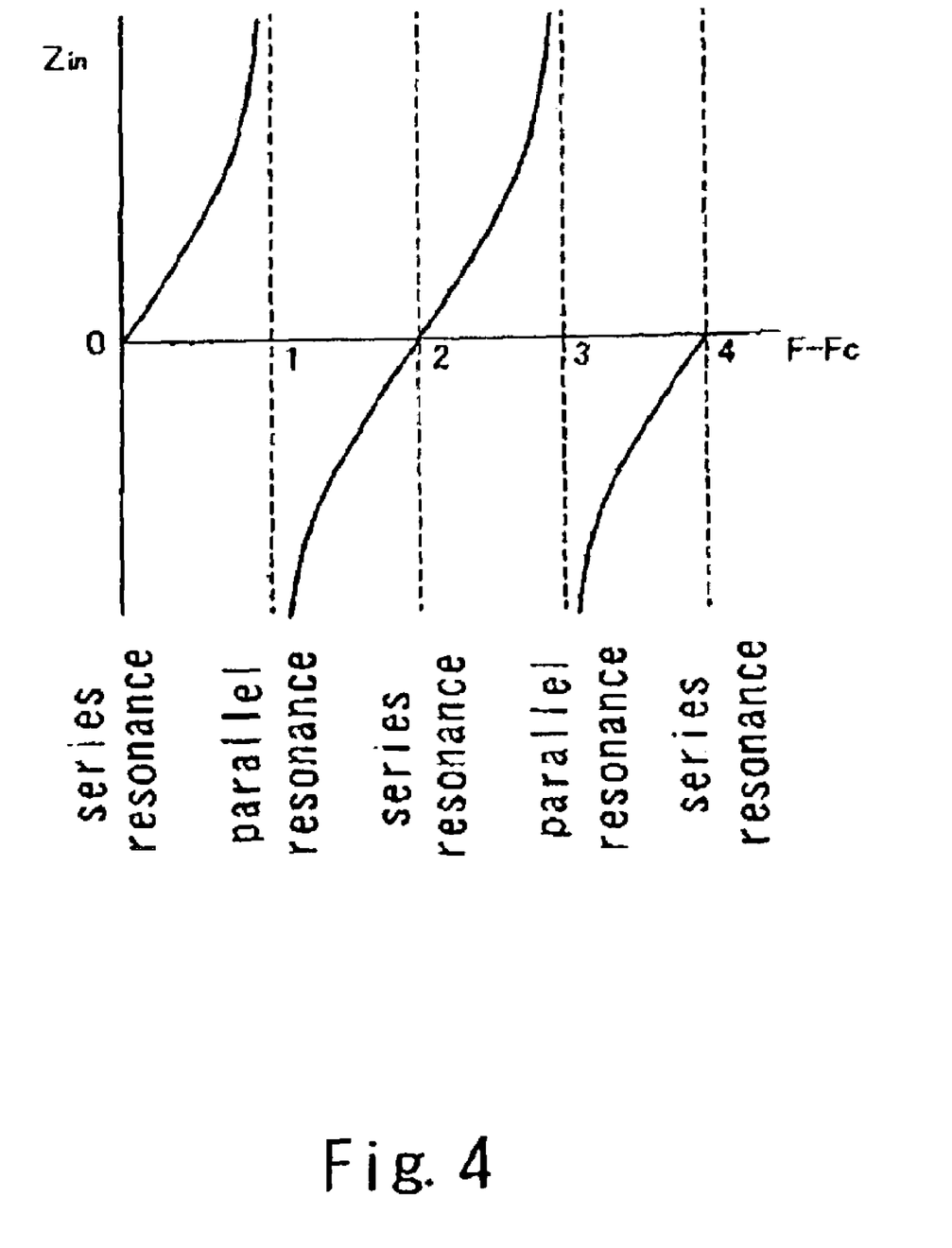
FIG. 4 shows the relation of Z and F-Fc in the formula (6).

FIG. 4 shows the relation of Z and $F-F_c$ in the formula(6). As understood from FIG. 4, when $F-F_c=2n$, the series resonance takes places, making the input impedance $Z_{in}$ zero, where n is integer Taking these points into consideration, the apparatus of this embodiment establishes the relation $F-F_c=2n$ so that state of the series resonance can be obtained. In other words, establishment of the relation $F-F_c=2n$ is in consideration of that free alternation of the circuit length x is difficult because it is subjected to limitations from requirements in designing the apparatus. Accordingly, for obtaining the resonance state even under the fixed circuit length x, the apparatus comprises the variable capacitor 63 in the coaxial resonator 6 to coordinate the capacitance $C_F$.

By such coordination of the capacitance $C_F$, the coaxial resonator 6 is in state of the series resonance at the frequency of the first HF power source 4, making the input impedance $Z_{in}$ zero. As a result, potential of the substrate holder 5 is made almost equal to the ground potential in view of HF. "Equal to the ground potential in view of HF" means that; the potential is kept equal to the ground as the result of the resonance, though potentials on the in-between line alter. Because the substrate holder 5 is made equal to the ground potential, the HF voltage of the same magnitude as generated at the first HF power source 4 is applied between the HF electrode 3 and the substrate holder 5 The series resonance takes places between the substrate holder 5 and the holder shield 12, between the support 611 and the bottom of the process chamber 1, and between support 611 and the outer conductor 62. Therefore, more precisely the shield 12 and the bottom of the process chamber 1 are the components of the outer conductor 12 of the coaxial resonator 6.

Contrarily, if the resonance condition as in the embodiment is not satisfied, the substrate holder 5 is no longer the ground potential in view of HF. It is still possible to ground the substrate holder in view of DC. "To ground in view of DC" means the usual way of grounding, i.e. directly connecting the substrate holder 5 and the ground by a conductor. Also in such the way, the substrate holder 5 is made the ground potential in view of HF to some extent as far as distance to the ground is short enough compared to the wavelength of the HF voltage. However, in case it is required to apply another HF voltage to the substrate 9 as in this embodiment, such the solution is impossible because the substrate holder 5 is required to be isolated from the ground in view of DC, i.e. to be floated. Therefore, the idea of this embodiment is especially preferable in applying another HF voltage to the substrate 9.

As shown in FIG. 1, an ammeter 7 is provided on the line between the variable capacitor 63 and the ground. In state of the series resonance, the maximum HF current flows through the variable capacitor 63 to the ground because the input impedance Zin is zero. Therefore, according to the indicated value on the ammeter 7, the capacitance of the variable capacitor 63 is coordinated so that the maximum HF current can be obtained.

The ammeter 7 is to measure the current at the frequency of the first HF power source 4. Concretely, the ammeter 7 comprises a tuning circuit or filtering circuit for measuring only the current at the frequency of the first HF power source 4. The current of the frequency of the second HF power source 50 is omitted at the ammeter 7. As the ammeter 7, a P-P (Peak-to-Peak) ammeter is preferable. P-P ammeters are kind of those which measure current amplitude, i.e. width of a positive peak and a negative peak. Though a normal ammeter to measure effective current may be used, a P-P ammeter is preferable because maximization of the current can be detected easily.

Next, whole operation of the apparatus will be described. The substrate 9 is transferred into the load-lock chamber (not shown) from the atmosphere side. After pumping the load-lock chamber and the process chamber 1 at a required vacuum pressure, a gate-valve (not shown) is opened. Then, the substrate 9 is transferred into the process chamber 1 by a transfer mechanism (not shown). The substrate 9 is placed at the required position on the substrate holder 5. The chucking power source (not shown) is operated to chuck the substrate 9 on the substrate holder 5.

After the gate-valve is closed, the process gas introduction line is operated, thereby introducing the process gas with the etching function at a required flow-rate. In this state, the first HF power source 4 and the second HF power source 50 are operated. As a result, the HF discharge is ignited, thereby producing the plasma, as well as the voltage for controlling the ion-bombardment energy is applied to the substrate 9. Radicals, activated species and ions are produced in the plasma. Those species reach the substrate 9, thereby etching the surface of the substrate 9.

In etching silicon oxide, for example, gas mixture of fluorocarbon ($CF_4$) and hydrogen ($H_2$) is introduced as the process gas. In the plasma are produced radicals, activated species and ions of fluoride or fluorine, and radicals, activated species and ions of hydrogen. Those species react with silicon oxide existing at the surface of the substrate 9, producing volatile substances such as silicon fluoride and water. Under such the mechanism, etching of the silicon oxide is carried out. Because the voltage for controlling the ion-bombardment energy is applied to the substrate 9, it is enabled to promote the etching by the bombardment energy of ions, and to obtain the good etching configuration with the small side-etching by ions incident perpendicularly onto the substrate 9.

After carrying out such the etching for a required period, the operations of the first HF power source 4, the second HF power source 50 and the process-gas introduction line 2 are stopped. The process chamber 1 is pumped again, and the substrate 9 is released from the electrostatic chuck. Then, the substrate 9 is picked up from the substrate holder 5, and transferred out to the atmosphere side via the load-lock chamber.

In the above operation of the apparatus, the probability of electrons to collide with neutral gas molecules is increased because a higher frequency that is in the VHF band is used. Therefore, the ionization efficiency is enhanced, improving the plasma generation efficiency. This brings the merits of contaminant reduction enabled by carrying out the process at a lower pressure, and a higher process speed enabled by increasing the plasma density.

In addition, when the first HF power source 4 is operated, because the impedance at the substrate holder 5 toward the ground is zero, the substrate holder 5 is the ground potential in view of HF, as described. Therefore, the maximum voltage is applied between the first HF electrode 3 and the substrate holder 5, which provides the HF field with the maximum intensity in igniting the HF discharge. This brings the critical advantage that ignition of the HF discharge is easy, i.e. enabling the discharge ignition at a lower power or at a lower pressure than in prior-art apparatuses. Specifically, the apparatus of this embodiment is supposed to ignite the discharge at a pressure not higher than 10 Pa. For example, it is 2 Pa. When the process is carried out as the discharge is ignited at such a low pressure, such contamination as impurity inclusion and process-gas-molecule inclusion into the substrate 9 can be reduced. Therefore, quality of the process is enhanced.

Because the coaxial resonator 6 is provided in coaxial to the substrate 9 held on the substrate holder 5, the propagation state of the HF wave is made coaxial to the substrate 9 as well. This brings the advantage of more uniformity of the process onto the substrate 9.

The frequency of the second HF power source 50 preferably disaccords with the frequency of the first HF power source 4. If the frequency of the second HF power source 50 accords with the frequency of the first HF power source 4, the HF wave from the second HF power source 50 also resonates in series at the coaxial resonator 6. As a result, the voltage for controlling the ion-bombardment energy is no longer applied to the substrate 9. Specifically, such a frequency as 13.56 MHz is practically employed for the second HF power source 50.

As shown in FIG. 1, the apparatus has the structure where the second HP power source 50 supplies the power initially at about the midpoint on the inner conductor 61. It is still possible to supply the power initially at the bottom end of the inner conductor 61. This structure has the merit that the HF power for controlling the ion-bombardment energy is supplied more uniformly, contributing to the more uniform substrate process. However, this structure has the demerit that whole height of the apparatus becomes larger. The structure where the power is initially supplied at about the midpoint of the inner conductor 61 does not have such the demerit.

Figure 5:
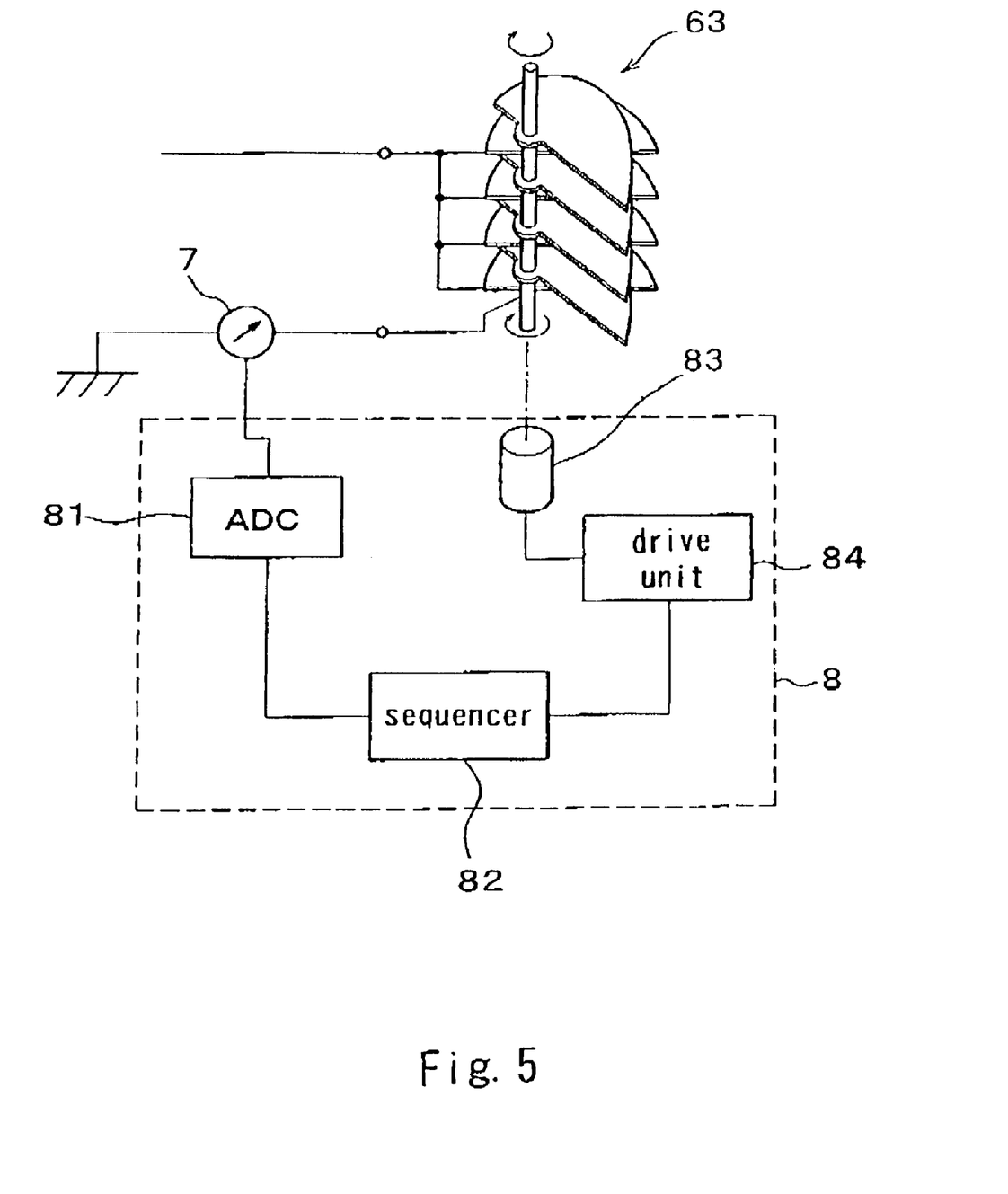
FIG. 5 is a schematic front cross-sectional view of the HF plasma processing apparatus as the second embodiment of the invention.

Next, the second embodiment of this invention will be described as follows. FIG. 5 is a schematic front cross-sectional view of the HF plasma processing apparatus as the second embodiment of the invention. The apparatus shown in FIG. 5 differs in the following points from the described first embodiment. First, the apparatus comprises a capacitance controller 8 as a reactance controller. The capacitance controller 8 automatically controls the capacitance of the variable capacitor 63. The capacitance controller 8 comprises an AD converter 81 to convert the analog signal from the ammeter 7 into a digital signal, a sequencer 82 to which the output of the AD converter 81 is inputted, a motor 83 to rotate one of electrodes of the variable capacitor 63 against the other one for varying the capacitance, and a drive unit 84 for driving the motor 83.

Control by the sequencer 82 will be described as follows. One of the directions on the rotation of the motor 83 is hereinafter "plus", the other one is "minus". The signal from the ammeter 7 is inputted to the sequencer 82 via the AD converter 81, initially as the motor 83 is rotated to the plus direction. If the signal is increased, the motor 83 is rotated to the same direction. If the signal is decreased, the motor 83 is rotated to the opposite minus direction. As the motor 83 is rotated to the direction where the signal is increased, the motor 83 is reversed at the moment the signal turns decreasing from increasing. Repeating the same way, the rotation is reversed when the signal turns decreasing after the maximum. In such the way, the variable capacitor 63 is controlled by the motor 83 so that the maximum current can flow through the ammeter 7. It is also preferable to memorize the position of the one electrode of the variable capacitor 63 where the maximum current is obtained, and to control the variable capacitor 63 so as to keep the memorized position. The sequencer 82 is programmed so that such the control can be carried out.

In the second embodiment, because the capacitance of the variable capacitor 63 is automatically controlled by the capacitance controller 8, coordination of the capacitance of the variable capacitor 63 is easy in fabricating the apparatus. In addition, when condition on the HF circuit is unexpectedly changed, the capacitance controller 8 automatically recovers the expected value. Moreover, the apparatus occasionally changes the operation condition for carrying out a different process, changing the condition on the HF circuit. Even in this case, the series resonance of the coaxial resonator B can be maintained because the capacitance controller 83 automatically coordinates the capacitance of the variable capacitor 63. Therefore, the described effect can be obtained stably.

In the above-described embodiments, the series resonance is established under the condition at the moment the HF discharge is ignited. This is because space impedance between the first HF electrode 3 and the substrate holder 5 changes before and after generation of the plasma by ignition of the HF discharge. Therefore, even if the resonance condition on the coaxial resonator 6 is satisfied before the discharge ignition, generally the resonance state is not maintained after the discharge ignition. Even so, higher power-supply efficiency at the moment of the discharge ignition, which is brought by the resonance state, still has the advantage, because insulation breakdown is required at the space for igniting the discharge. In case that the resonance state is required to be maintained consistently after the discharge ignition, the capacitance of the variable capacitor 63 is negative-feedback-controlled as the HF current is monitored. Because the impedance at the discharge space occasionally changes unstably after the plasma is generated, it is preferable to adopt a control system with high responsibility.

Though 60 MHz in the VHF band was adopted as frequency not lower than 30 MHz in the described embodiments, it is not limiting. A more higher frequency such as one over 100 MHz may be adopted. Though the resonator for the series resonance was the coaxial type, the cylindrical type, i.e. without the inner conductor, may be adopted. Otherwise, a rectangular cavity resonator may be adopted, which would be practical for processing a square substrate such as one for a liquid crystal display. An inductance controller such as one comprising a variable inductor coil may be adopted instead of the described one comprising the variable capacitor 63. Furthermore, the reactance can be varied by such a member as a stub tuner. Any one of variable reactance elements can be adopted for the same purpose.

The common use of the substrate holder 5 as the second HF electrode in the described embodiments has the advantage of simplifying the structure in the process chamber 1. It also has the advantage of enhancing the process productivity by utilizing the plasma efficiently, because the substrate 9 is held close to the plasma. Still, any other HF electrode may be provided than the substrate holder 5. Though the second HF electrode was a part of the inner conductor 61, whole the inner conductor 61 may be the second HF electrode.

Though the etching was described as the example of substrate processes, the invention is also applicable to film deposition processes such as sputtering and chemical-vapor-deposition (CVD), surface treatments such as surface oxidation and surface nitrification, and ashing of photo-resist.

As for the substrate 9 to be processed, the invention is also applicable to substrates for display devices such as LCDs and plasma displays, and substrates for magnetic devices such as magnetic heads.

What is claimed is:

1. A High-Frequency (HF) plasma processing apparatus, comprising:
    a process chamber in which a substrate to be processed is placed;
    a pumping line pumping the process chamber at a required vacuum pressure;
    a process-gas introduction line for introducing a process gas into the process chamber;
    a first HF electrode provided in the process chamber;
    a first HF power source for applying voltage to the first HF electrode, thereby generating plasma of the process gas;
    a second HF electrode facing the first HF electrode in the process chamber, interposing discharge space;
    a coaxial resonator interconnecting the second electrode and the ground;
    an inner conductor supporting the second electrode at an end; and
    an outer conductor surrounding the inner conductor outside the process chamber, wherein:
    the inner conductor and the outer conductor are components of the coaxial resonator;
    the coaxial resonator is resonant as a distributed constant circuit at the frequency of the first HF power source;
    the coaxial resonator has a circuit length from the second electrode to the ground; and
    series resonance takes place in the whole circuit length of the coaxial resonator at a frequency of the first HF power source.

2. A High-Frequency plasma processing apparatus as claimed in claim 1, further comprising:
    a variable capacitor provided between another end of the inner conductor and the ground, wherein
    the variable capacitor is another component of the coaxial resonator; and has coordinated capacitance to make series resonance take place between the second electrode and the ground at the frequency of the first HF power source.

3. A High-Frequency plasma processing apparatus as claimed in claim 1, wherein the frequency of the first HF power source is not lower than 30 MHz.

4. A High-Frequency plasma processing apparatus as claimed in claim 1, wherein a cavity of the coaxial resonator is located outside the process chamber.

5. A High-Frequency plasma processing apparatus as claimed in claim 4, wherein:
    the inner conductor is extended through a wall of the process chamber to the outside of the process chamber; and
    the outer conductor is fitted to the outer surface of the wall of the process chamber.

6. A High-Frequency plasma processing apparatus as claimed in claim 1, further comprising an ammeter for measuring the current flowing through the coaxial resonator.

7. A High-Frequency plasma processing apparatus as claimed in claim 6, wherein the ammeter is a peak-to-peak ammeter to measure width of a positive peak and a negative peak.

8. A High-Frequency plasma processing apparatus as claimed in claim 1, wherein the second HF electrode is commonly used as a substrate holder for holding the substrate at a required position in the process chamber.

9. A High-Frequency plasma processing apparatus as claimed in claim 8, further comprising:
    a second HF power source connected with the substrate holder for controlling ion-bombardment energy onto the substrate, wherein
    a frequency of the second HF power source differs from the first HF power source.

10. A High-Frequency plasma processing apparatus as claimed in claim 1, wherein the first HF power Source applies the voltage to generate the plasma at a pressure not higher than 10 Pa.

11. A High-Frequency plasma processing apparatus as claimed in claim 5, wherein an insulator is filled in a gap between the inner conductor and the wall of the process chamber.

* * * * *